United States Patent
White et al.

(10) Patent No.: US 8,008,202 B2
(45) Date of Patent: Aug. 30, 2011

(54) RUTHENIUM CMP COMPOSITIONS AND METHODS

(75) Inventors: Daniela White, Oswego, IL (US); John Parker, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 960 days.

(21) Appl. No.: 11/888,406

(22) Filed: Aug. 1, 2007

(65) Prior Publication Data

US 2009/0035942 A1    Feb. 5, 2009

(51) Int. Cl.
*B24D 3/34* (2006.01)
*H01L 21/302* (2006.01)

(52) U.S. Cl. .......... 438/692; 257/E21.214; 51/307; 51/308; 51/309

(58) Field of Classification Search .......... None
See application file for complete search history.

(56) References Cited

U.S. PATENT DOCUMENTS

| | | | | |
|---|---|---|---|---|
| 4,105,516 A * | 8/1978 | Martinsons et al. | .......... | 205/351 |
| 5,976,928 A * | 11/1999 | Kirlin et al. | .......... | 438/240 |
| 6,527,622 B1 * | 3/2003 | Brusic et al. | .......... | 451/28 |
| 6,776,810 B1 * | 8/2004 | Cherian et al. | .......... | 51/307 |
| 6,797,624 B2 * | 9/2004 | Lee | .......... | 438/692 |
| 6,821,187 B2 * | 11/2004 | Beitel et al. | .......... | 451/5 |
| 6,869,336 B1 * | 3/2005 | Hardikar | .......... | 451/41 |
| 6,884,723 B2 * | 4/2005 | Sinha et al. | .......... | 438/691 |
| 6,943,039 B2 * | 9/2005 | Ying et al. | .......... | 438/3 |
| 7,049,237 B2 * | 5/2006 | Uhlenbrock et al. | .......... | 438/692 |
| 7,097,541 B2 | 8/2006 | DeRege Thesauro et al. | | |
| 7,160,807 B2 | 1/2007 | De Rege Thesauro et al. | | |
| 7,161,247 B2 * | 1/2007 | De Rege Thesauro et al. | .......... | 257/741 |
| 7,244,678 B2 * | 7/2007 | Sinha et al. | .......... | 438/691 |
| 7,265,055 B2 * | 9/2007 | Thompson et al. | .......... | 438/692 |
| 7,306,637 B2 * | 12/2007 | Cherian et al. | .......... | 51/307 |
| 7,316,977 B2 * | 1/2008 | Siddiqui et al. | .......... | 438/693 |
| 7,732,393 B2 * | 6/2010 | Grumbine et al. | .......... | 510/175 |
| 2002/0197855 A1 | 12/2002 | Kim et al. | | |
| 2003/0003747 A1 * | 1/2003 | Kim et al. | .......... | 438/693 |
| 2003/0119321 A1 * | 6/2003 | Uhlenbrock et al. | .......... | 438/692 |
| 2003/0124867 A1 * | 7/2003 | Lee | .......... | 438/697 |
| 2004/0067649 A1 * | 4/2004 | Hellring et al. | .......... | 438/689 |

(Continued)

OTHER PUBLICATIONS

Martin T. Lemaire, "Recent Developments in the Coordination Chemistry of Stable Free Radicals," Pure Appl. Chem., vol. 76, No. 2, pp. 277-293 (2004).

(Continued)

*Primary Examiner* — Allan Olsen
(74) *Attorney, Agent, or Firm* — Thomas E. Omholt; Robert J. Ross; Steven D. Weseman

(57) ABSTRACT

The present invention provides a chemical-mechanical polishing (CMP) composition for polishing a ruthenium-containing substrate in the presence of an oxidizing agent such as hydrogen peroxide without forming a toxic level of ruthenium tetroxide during the polishing process. The composition comprises a particulate abrasive (e.g., silica, alumina, and/or titania) suspended in an aqueous carrier containing a ruthenium-coordinating oxidized nitrogen ligand (N—O ligand), such as a nitroxide (e.g., 4-hydroxy-TEMPO). In the presence of the oxidizing agent, the N—O ligand prevents the deposition of ruthenium species having an oxidation state of IV or higher on the surface of the substrate, and concomitantly forms a soluble Ru(II) N—O coordination complex with oxidized ruthenium formed during CMP of the substrate. CMP methods for polishing ruthenium-containing surfaces with the CMP composition are also provided.

20 Claims, 3 Drawing Sheets

U.S. PATENT DOCUMENTS

| | | | |
|---|---|---|---|
| 2004/0077295 A1* | 4/2004 | Hellring et al. | 451/41 |
| 2004/0147123 A1* | 7/2004 | Kim et al. | 438/689 |
| 2004/0214444 A1* | 10/2004 | Kim et al. | 438/692 |
| 2005/0064798 A1* | 3/2005 | Hardikar | 451/41 |
| 2006/0024967 A1* | 2/2006 | De Rege Thesauro et al. | 438/692 |
| 2006/0037942 A1* | 2/2006 | Yun et al. | 216/88 |
| 2006/0117667 A1* | 6/2006 | Siddiqui et al. | 51/309 |
| 2007/0049025 A1* | 3/2007 | Siddiqui et al. | 438/687 |
| 2007/0090094 A1 | 4/2007 | Thompson et al. | |
| 2007/0219104 A1* | 9/2007 | Grumbine et al. | 510/175 |
| 2008/0038995 A1* | 2/2008 | Small et al. | 451/37 |
| 2008/0067077 A1* | 3/2008 | Kodera et al. | 205/645 |
| 2008/0076688 A1* | 3/2008 | Barnes et al. | 510/175 |
| 2008/0105652 A1* | 5/2008 | Brusic et al. | 216/89 |
| 2008/0148649 A1* | 6/2008 | Liu | 51/298 |
| 2009/0124173 A1* | 5/2009 | Li | 451/37 |
| 2009/0192065 A1* | 7/2009 | Korzenski et al. | 510/176 |
| 2010/0200802 A1* | 8/2010 | Grumbine et al. | 252/79.1 |

OTHER PUBLICATIONS

Dasna, et al., "A Dimeric Cu(II) Acetate Complex Containing Axial Coordinated p-Pyridyl Nitronyl Nitroxide Radicals . . . ," New J. Chem, vol. 24, pp. 903-906 (2000).

* cited by examiner

RUTHENIUM CMP COMPOSITIONS AND METHODS

FIELD OF THE INVENTION

This invention relates to polishing compositions and methods for polishing a substrate using the same. More particularly, this invention relates to chemical-mechanical polishing (CMP) compositions for polishing ruthenium-containing substrates.

BACKGROUND OF THE INVENTION

Semiconductor wafers typically have a complex structure composed of a substrate on which a plurality of transistors has been formed. Integrated circuits are chemically and physically connected into a substrate by patterning regions in the substrate and layers on the substrate with various materials including metals, insulators, and semiconductors. In order to produce an operable semiconductor wafer and to maximize the yield, performance, and reliability of the wafer, it is desirable to polish selected surfaces of the wafer (e.g., a metal-containing surface) without adversely affecting underlying structures or topography. This complexity leads to difficulties in designing effective polishing systems for semiconductor wafers. In fact, various problems in semiconductor fabrication can occur if the process steps are not performed on wafer surfaces that are adequately flat and uniform (planarized). Because the performance of a semiconductor wafer is directly associated with the planarity of its surface, it is crucial to use a polishing composition and method that results in a high polishing efficiency, uniformity, provides a high material removal rate, and leaves a high quality finish with minimal surface defects. In many cases, the hardness and chemical stability of the various materials making up the wafer can vary widely, further complicating the polishing process.

Conventional polishing systems and polishing methods typically are not entirely satisfactory at planarizing metal-containing semiconductor wafers. In particular, polishing compositions and polishing pads can have less than desirable polishing rates, and their use in the chemical-mechanical polishing (CMP) of semiconductor surfaces can result in poor surface quality. This is particularly true for noble metals such as ruthenium, which is utilized in fabricating high performance semiconductor devices and capacitors in dynamic random access memory (DRAM) devices.

Current ruthenium polishing compositions typically rely on relatively hard abrasives such as $\alpha$-alumina, and strong oxidizing agents, such as oxone or ceric ammonium nitrate, to provide adequate ruthenium removal rates (e.g., at least about 100 Angstroms-per-minute (A/min) Ru removal rate). This is due, at least in part, to the high degree of chemical inertness and strong response to mechanical abrasion exhibited by ruthenium barrier layers. Typically, relatively weak oxidants such as hydrogen peroxide are not very efficient in ruthenium polishing processes, requiring long polishing times and a high polishing pressure in order to adequately planarize the ruthenium.

Conventional ruthenium CMP compositions that utilize strong oxidants, such as oxone or ceric ammonium nitrate, work by oxidizing the ruthenium to relatively high oxidation state ruthenium species, such as toxic and undesirable ruthenium(VIII) tetroxide ($RuO_4$), and concomitantly dissolving the oxidized ruthenium species from the surface of the substrate, aided by the hard abrasive (e.g., $\alpha$-alumina). Use of milder oxidants (e.g., hydrogen peroxide), and the use of softer abrasives (e.g., silica or titania), generally are not practical, due to the relatively low ruthenium removal rates (e.g., <100 Å/min) achieved under such conditions. Accordingly, uniform CMP of patterned wafers can be difficult to achieve, due to the harsh conditions typically required for ruthenium removal, which can result in over-removal of other materials, such as silicon dioxide (e.g., plasma enhanced tetraethylorthosilicate-derived silicon dioxide, PETEOS), resulting in poor surface quality.

Many compositions and methods for chemical-mechanical polishing (CMP) the surface of a substrate are known in the art. Polishing compositions (also known as polishing slurries, CMP slurries, and CMP compositions) typically contain an abrasive material in an aqueous carrier. A surface of a substrate is abraded to polish the surface by urging the surface of the substrate into contact with the polishing pad at a selected force (down force) and moving the polishing pad relative to the surface while maintaining a CMP slurry and oxidizing agent between the pad and the surface of the substrate. Typical abrasive materials include silicon dioxide (silica), cerium oxide (ceria), aluminum oxide (alumina), zirconium oxide (zirconia), titanium dioxide (titania), and tin oxide. U.S. Pat. No. 5,527,423 to Neville et al., for example, describes a method for chemically-mechanically polishing a metal layer by contacting the surface with a polishing slurry comprising high purity fine metal oxide particles in an aqueous medium. Alternatively, the abrasive material may be incorporated into the polishing pad. U.S. Pat. No. 5,489,233 to Cook et al. discloses the use of polishing pads having a surface texture or pattern, and U.S. Pat. No. 5,958,794 to Bruxvoort et al. discloses a fixed abrasive polishing pad.

In conventional CMP techniques, a substrate carrier or polishing head is mounted on a carrier assembly and positioned in contact with a polishing pad in a CMP apparatus. The substrate is mounted on the polishing head. The carrier assembly provides a controllable pressure (down force) to urge the substrate against the polishing pad. The pad is moved relative to the substrate by an external driving force. The relative movement of the substrate and pad serves to abrade the surface of the substrate to remove a portion of the material from the substrate surface, thereby polishing the substrate. The polishing of the substrate by the relative movement of the pad and the substrate typically is further aided by the chemical activity of the polishing composition and/or the mechanical activity of an abrasive suspended in the polishing composition. It is highly desirable to utilize polishing compositions that are compatible with CMP apparatus as described herein.

The harsh conditions typically required for ruthenium removal can result in undesirable separation of the ruthenium layer from the interlayer insulating layer, as well as dishing and erosion effects on the ruthenium layer adjacent to the interlayer. In many cases, it is also desirable for Ru CMP compositions to provide relatively high silicon dioxide removal rates (e.g., at least about 100 A/min, preferably about 200 A/min or greater for removal of PETEOS), in addition to relatively high Ru removal rates and low defectivity.

There is an ongoing need to develop CMP compositions that are capable of polishing a semiconductor substrate, particularly a ruthenium-containing substrate, without the use of strong, $RuO_4$-generating oxidants, and which exhibit relatively high ruthenium removal rates. The present invention provides such CMP compositions. These and other advantages of the invention, as well as additional inventive features, will be apparent from the description of the invention provided herein.

BRIEF SUMMARY OF THE INVENTION

The present invention provides a CMP composition useful for polishing a ruthenium-containing substrate in the presence of an oxidizing agent such as hydrogen peroxide without generating toxic levels of $RuO_4$. The compositions of the invention comprise a particulate abrasive suspended in an aqueous carrier containing a ruthenium-coordinating oxidized nitrogen-ligand (N—O ligand), such as a nitroso compound, a nitroxide, an imino nitroxide, a nitronyl nitroxide, an oxime, a hydroxamic acid, and the like. In the presence of an oxidizing agent, the N—O ligand prevents deposition of relatively high oxidation state ruthenium species (i.e., Ru(IV) or higher) on the surface of the substrate and concomitantly forms a soluble Ru(II) N—O coordination complex to aid in removal of ruthenium from the surface of the substrate. The combined chemical activity of the oxidizing agent and the N—O ligand allows for the use of relatively soft abrasive materials, such as titania and colloidal silica, if desired. Preferably, the compositions of the invention comprise about 1 to about 10 percent by weight of the particulate abrasive (e.g., silica, titania, or alumina), and about 0.01 to about 0.5 percent by weight of the N—O ligand. When used to polish a ruthenium-containing substrate, the composition preferably is combined with the oxidizing agent at a concentration of oxidizing agent in the range of about 1 to about 5 percent by weight, based on the combined weight of the composition and the oxidizing agent.

In some preferred embodiments, the compositions of the invention utilize alumina or titania as the particulate abrasive. In other preferred embodiments, the compositions of the invention utilize colloidal silica or a combination of colloidal silica and titania as the abrasive.

In some preferred embodiments, the compositions of the invention include a nitroxide compound and ascorbic acid, preferably in about a 1:1 molar ratio of ascorbic acid-to-nitroxide compound.

The compositions of the present invention desirably can be tailored to provide a ruthenium-to-silicon dioxide removal selectivity, which favors either ruthenium removal or silicon dioxide removal, as may be needed for a given polishing application. In some preferred embodiments, e.g., utilizing alumina or titania abrasives, the compositions of the invention provide a ruthenium-to-silicon oxide removal selectivity that favors ruthenium removal, and provide a relatively high ruthenium removal rate of at least about 100 Å/min, preferably about 200 Å/min or greater, when utilized in typical CMP processes. In other preferred embodiments, e.g., utilizing colloidal silica or a mixture of colloidal silica and titania, the compositions of the invention provide a ruthenium-to-silicon oxide removal selectivity that favors silicon dioxide (e.g., PETEOS) removal, while still providing adequate ruthenium removal rates.

In another aspect, the present invention provides CMP methods for polishing a ruthenium-containing substrate. Preferred methods comprise the steps of contacting a surface of the substrate (e.g., a ruthenium-containing substrate) with a polishing pad and an aqueous CMP composition of the present invention, in the presence of an oxidizing agent such as hydrogen peroxide, and causing relative motion between the polishing pad and the substrate while maintaining at least a portion of the CMP composition and the oxidizing agent in contact with the surface between the pad and the substrate for a time period sufficient to abrade at least a portion of the ruthenium from the surface of the substrate.

In one method embodiment, the present invention provides a method of selectively removing ruthenium from the surface of the substrate in preference to removal of silicon dioxide (e.g., PETEOS). In this embodiment, the abrasive can be either alumina or titania.

In another method embodiment, the present invention provides a method of selectively removing silicon dioxide (e.g., PETEOS) from the surface of the substrate in preference to removal of ruthenium. In this embodiment, the abrasive comprises colloidal silica. In some preferred embodiments, the abrasive includes titania and colloidal silica.

DETAILED DESCRIPTION OF THE INVENTION

Figure 1:
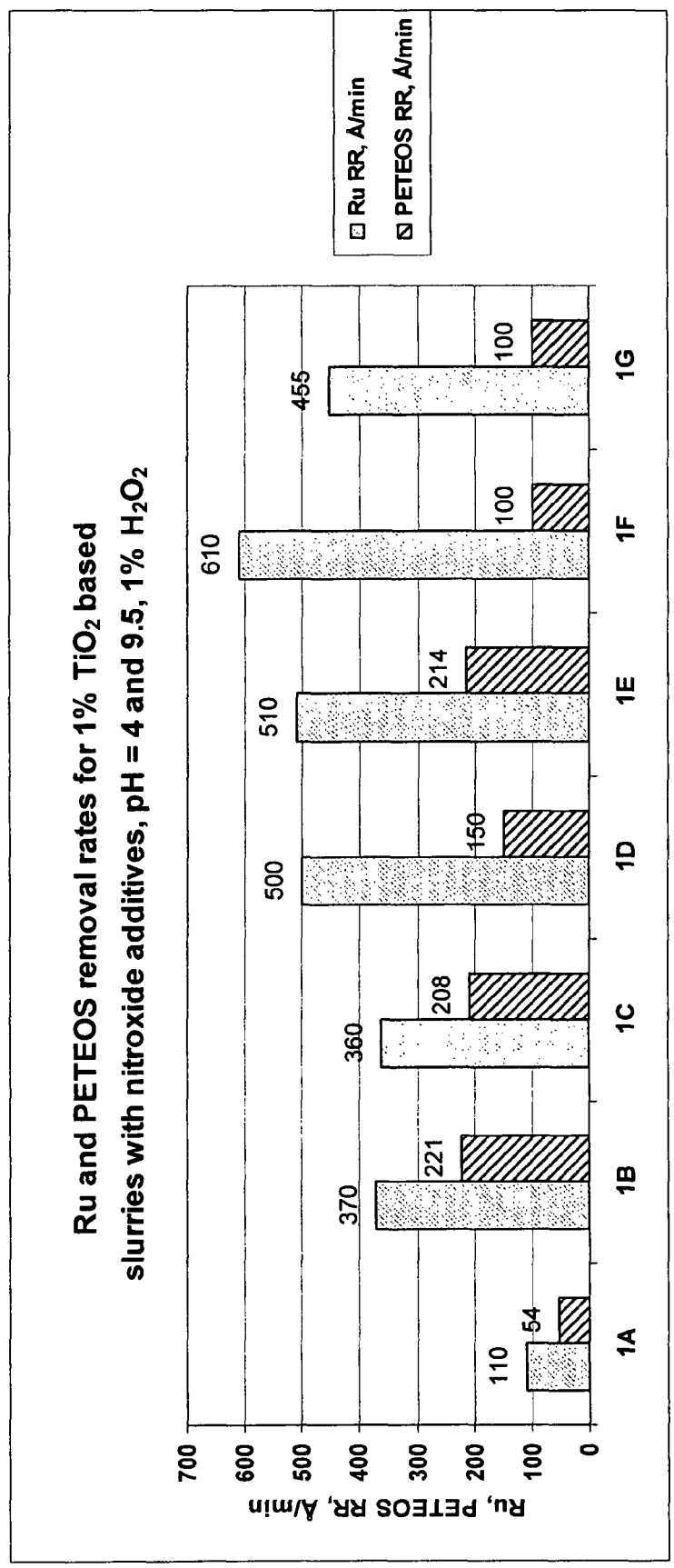
FIG. 1 presents a bar graph of ruthenium and PETEOS removal rates obtained with compositions of the invention containing titania and alumina abrasives, compared to a conventional alumina- and titania-based CMP composition.

The present invention provides a CMP composition for polishing a ruthenium-containing substrate in the presence of an oxidizing agent such as hydrogen peroxide, an organic peroxide, an organic hydroperoxide, a periodate, a perborate, and the like, without forming a toxic level of ruthenium tetroxide during the polishing process. The composition comprises a particulate abrasive suspended in an aqueous carrier containing a ruthenium-coordinating oxidized nitrogen ligand (N—O ligand). In the presence of the oxidizing agent, the N—O ligand is capable of preventing the deposition of ruthenium species having an oxidation state of IV or higher on the surface of the substrate, and concomitantly is capable of forming soluble Ru(II) N—O coordination complexes with oxidized ruthenium formed during CMP of the substrate. It is believed that the N—O ligand reduces relatively high oxidation state ruthenium (i.e., Ru(IV) and higher) to Ru(II), and then forms a soluble complex with the so-formed Ru(II) species. The Ru(II) complex is believed to involve coordination with both the N and the O atoms of the ligand.

A preferred CMP composition of the invention comprises about 1 to about 10 percent by weight of a particulate abrasive suspended in an aqueous carrier containing about 0.01 to about 0.5 percent by weight of an N—O ligand, preferably a nitroxide compound.

As used herein, the terms "oxidized nitrogen ligand" and "N—O-ligand" refer to organic compounds containing a nitrogen-based functional group bearing an oxygen atom or other oxygen functional group (e.g., a hydroxyl group), which either directly coordinates with oxidized ruthenium, e.g., Ru(II), or which forms such a coordinating ligand in situ (e.g., by reaction with hydrogen peroxide). Non-limiting examples of N—O ligands include nitroxides, imino nitroxides, nitronyl nitroxides, oximes, hydroxamic acids, and the like. Non-limiting examples of nitroxides include 2,2,6,6-tetramethylpiperidine-1-oxyl (TEMPO), 4-hydroxy-TEMPO, and the like. Non-limiting examples of imino nitroxides include 2-pyridyl-4,4,5,5-tetramethyl-1,3-diazacyclopent-2-ene-1-oxyl, 4-hydrazonomethyl-1-hydroxy-2,2,5,5-tetramethyl-3-imidazoline-3-oxide, and the like. Non-limiting examples of suitable nitronyl nitroxides include 2-pyridyl-4,4,5,5-tetramethyl-1,3-diazacyclopent-2-ene-1-oxyl-3-oxide, and the like. Non-limiting examples of oximes include pinacolone oxime, progesterone 3-(O-carboxymethyl)oxime, propionaldehyde O-pentafluorophenylmethyloxime, (E)-benzaldehyde oxime, 1,2-indandione-2-oxime, 1-indanone oxime, 2,2,4,4-tetramethyl-3-pentanone oxime, 2-adamantanone oxime, 2-butanone oxime, 2-chlorobenzaldehyde oxime, and the like. Non-limiting, examples of hydroxamic acids include acetylhydroxamic acid, salicylhydroxamic acid, and the like. In some particularly preferred embodiments, the compositions of the invention the N—O ligand comprises a nitroxide compound such as 4-hydroxy-TEMPO. The N—O ligand preferably is present in the compositions of the invention at a concentration in the range of about 0.01 to about 0.5 percent by weight.

The CMP compositions of the invention are utilized to polish ruthenium substrates in the presence of an oxidizing agent such as hydrogen peroxide. Preferably, the oxidizing agent is present at a concentration in the range of about 1 to about 5 percent by weight during the CMP process. The oxidizing agent preferably is added to the CMP composition just prior to initiation of the CMP process. In addition to hydrogen peroxide, other useful mild oxidizers include, without limitation, perborates, periodates, organic peroxides and hydroperoxides, (e.g., di-tert-butyl peroxide, di-tert-amyl peroxide, benzoyl peroxide, tert-butyl-hydroperoxide, and tert-amyl-hydroperoxide), and the like.

The CMP compositions of the invention also include a particulate abrasive. The abrasive can be any abrasive material suitable for use in CMP processes, such as silica, alumina, titania, zirconia, ceria, doped silica, and combinations thereof. Preferably, the abrasive comprises alumina, titanium dioxide, silica (e.g., colloidal silica or fumed silica), or a combination of two or more of these abrasives. In some embodiments, a combination of titania and colloidal silica is preferred. The particulate abrasive preferably has a mean particle size in the range of about 30 to about 200 nm, e.g., as determined by laser light scattering techniques. Preferably, the particulate abrasive is present in the composition at a concentration in the range of about 1 to about 10 percent by weight.

The abrasive desirably is suspended in the CMP composition, more specifically in the aqueous component of the CMP composition. When the abrasive is suspended in the CMP composition, the abrasive preferably is colloidally stable. The term colloid refers to the suspension of abrasive particles in the liquid carrier. Colloidal stability refers to the maintenance of that suspension over time. In the context of this invention, a suspension of a particulate abrasive is considered colloidally stable if, when the suspension is placed into a 100 mL graduated cylinder and allowed to stand without agitation for a time of 2 hours, the difference between the concentration of abrasive particles suspended in the bottom 50 mL of the graduated cylinder ([B] in terms of g/mL) and the concentration of abrasive particles suspended in the top 50 mL of the graduated cylinder ([T] in terms of g/mL) divided by the initial concentration of particles in the abrasive composition ([C] in terms of g/mL) is less than or equal to 0.5 (i.e., ([B]−[T])/[C]≦0.5). The value of ([B]−[T])/[C] desirably is less than or equal to 0.3, and preferably is less than or equal to 0.1.

The CMP compositions of the invention can have any pH that is compatible with the redox chemistry involved in the oxidation of ruthenium by the oxidizing agent, and is compatible with the formation of Ru(II) N—O ligand complexes. Preferably, the pH of the compositions is in the range of about 2 to about 10.

The aqueous carrier can be any aqueous liquid suitable for use in a CMP process. Such compositions include water, aqueous alcohol solutions, and the like. Preferably, the aqueous carrier comprises deionized water.

The CMP compositions of the invention optionally can comprise one or more additives, such as a surfactant, a Theological control agent (e.g., a viscosity enhancing agent or coagulant), a corrosion inhibitor (e.g., benzotriazole (BTA) or 1,2,4-triazole (TAZ)), a dispersant, a biocide, and the like. In some embodiments (e.g., titania-based compositions) the compositions of the invention comprise a material that can form a charge transfer complex with the abrasive surface, such as ascorbic acid. When ascorbic acid is present in the CMP composition, it forms a charge-transfer complex with the surface of the abrasive (e.g., titania), which can generates a higher energy oxidant, such as superoxide radical anion, which is a more efficient oxidant for Ru compared to hydrogen peroxide.

The CMP compositions of the invention can be prepared by any suitable technique, many of which are known to those skilled in the art. For example, the CMP composition can be prepared in a batch or continuous process. Generally, the CMP composition can be prepared by combining the components thereof in any order. The term "component" as used herein includes individual ingredients (e.g., abrasive, N—O ligand, acids, bases, and the like) as well as any combination of ingredients. For example, the N—O ligand can be dissolved in water, the abrasive can be dispersed in the resulting solution, and any additional additive materials such as Theological control agents, buffers, and the like can then be added and mixed by any method that is capable of uniformly incorporating the components into the CMP composition. The pH can be adjusted at any suitable time, if needed. The oxidizing agent, e.g., hydrogen peroxide, can be added just prior to, and/or during, the CMP process.

The CMP compositions of the present invention also can be provided as a concentrate, which is intended to be diluted with an appropriate amount of aqueous carrier prior to use. In such an embodiment, the CMP composition concentrate can comprise an abrasive, a N—O ligand compound, and any other components dispersed or dissolved in an aqueous carrier in amounts such that, upon dilution of the concentrate with an appropriate amount of aqueous carrier (e.g., water), each component of the polishing composition will be present in the CMP composition in an amount within the appropriate range for use.

The present invention also provides methods of polishing a ruthenium-containing substrate, which comprises abrading the surface of the substrate with a CMP composition of the invention, as described herein, in the presence of an oxidizing agent such as hydrogen peroxide (e.g., about 1 to about 5 percent by weight hydrogen peroxide).

In a preferred method aspect, the present invention provides a CMP method for selectively removing ruthenium from the surface of a substrate in preference to silicon dioxide. The method comprises (a) contacting a surface of a substrate with a polishing pad and an aqueous CMP composition of the invention, as described herein, in the presence of an oxidizing agent such as hydrogen peroxide; and (b) causing relative motion between the polishing pad and the substrate while maintaining a portion of the CMP composition and the oxidizing agent in contact with the surface between the pad and the substrate for a time period sufficient to abrade at least some ruthenium from the surface. Preferably, the particulate abrasive comprises alumina, titania, or a combination thereof.

In another preferred method aspect, the invention provides a CMP method for selectively removing silicon dioxide from the surface of a substrate in preference to ruthenium. The method comprises (a) contacting a surface of a substrate with a polishing pad and an aqueous CMP composition of the invention in the presence of an oxidizing agent such as hydrogen peroxide; and (b) causing relative motion between the polishing pad and the substrate while maintaining a portion of the CMP composition and oxidizing agent in contact with the surface between the pad and the substrate for a time period sufficient to abrade at least a portion ruthenium present in the substrate from the surface. The particulate abrasive comprises colloidal silica or a combination of colloidal silica and titania. A combination of colloidal silica and titania is particularly preferred, in which, the titania preferably is present in a weight ratio of silica-to-titania in the range of about 60:1 to about 6:1.

The CMP methods of the present invention can be used to polish any suitable substrate, and are especially useful for polishing semiconductor substrates comprising ruthenium. Suitable substrates include, without limitation, wafers used in the semiconductor industry.

The CMP methods of the present invention are particularly suited for use in conjunction with a chemical-mechanical polishing apparatus. Typically, the CMP apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. A CMP composition of the invention and an oxidizing agent such as hydrogen peroxide are deposited onto the polishing pad, so that some the CMP composition and oxidizing agent are disposed between the pad and the substrate. The polishing of the substrate takes place by the combined chemical and mechanical action of the polishing pad, the CMP composition of the invention, and the oxidizing agent, which act together to oxidize and abrade the substrate surface.

A substrate can be planarized or polished with a CMP composition of the invention using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353 to Sandhu et al., U.S. Pat. No. 5,433,651 to Lustig et al., U.S. Pat. No. 5,949,927 to Tang, and U.S. Pat. No. 5,964,643 to Birang et al. Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate the invention but, of course, should not be construed as in any way limiting its scope.

EXAMPLE 1

This example illustrates the use of compositions of the invention comprising a titania abrasive and 4-hydroxy-TEMPO ("4-HOT") to polish ruthenium and PETEOS blanket wafers.

CMP compositions of the invention were prepared, which had the formulations shown in Table 1. The compositions were utilized to polish ruthenium and PETEOS blanket wafers (about 4-inch diameter) in the presence of about 1 percent by weight hydrogen peroxide, on a Logitech polisher having a D100 polishing pad, under the following polishing conditions: platen speed of about 93 revolutions-per-minute (rpm), carrier speed of about 90 rpm, down pressure of about 3.1 pounds-per-square inch (psi), and a slurry flow rate of about 180 milliliters-per-minute (mL/min). FIG. 1 provides a graph of the ruthenium and PETEOS removal rates observed for each composition, in comparison to control compositions comprising about 0.7 percent by weight alumina or about 1 percent by weight titania, and having no added N—O ligand.

TABLE 1

| Example | Formulation |
|---|---|
| 1A control | 0.7 wt. % alumina (98 nm mean particle size); final pH of about 8.5 |
| 1B control | 1 wt. % of a pH 9.5 aqueous dispersion of titanium dioxide (120 nm mean particle size); final pH of about 9.5 |
| 1C control | 1 wt. % of a pH 2.8 aqueous dispersion of titanium dioxide (150 nm mean particle size); final pH of about 4 |
| 1D | 1 wt. % of a pH 2.8 aqueous dispersion of titanium dioxide (150 nm mean particle size), and 0.05 wt. % 4-HOT; final pH of about 4 |
| 1E | 1 wt. % of a pH 9.5 aqueous dispersion of titanium dioxide (120 nm mean particle size), and 0.05 wt. % 4-HOT; final pH of about 9.5 |
| 1F | 1 wt. % of a pH 2.8 aqueous dispersion of titanium dioxide (150 nm mean particle size), 0.05 wt. % 4-HOT, and about 1 molar equiv. ascorbic acid relative to 4-HOT; final pH of about 4 |
| 1G | 1 wt. % of a pH 9.5 aqueous dispersion of titanium dioxide (120 nm mean particle size), 0.05 wt. % 4-HOT, and about 1 molar equiv. ascorbic acid relative to 4-HOT; final pH of about 4 |

The data in FIG. 1 demonstrate that compositions of the invention (1D, 1E, 1F, and 1G) including a titania abrasive provided significant and unexpected increases in the ruthenium removal rates compared to the conventional titania control slurry (control compositions (1B and 1C), as well as a conventional alumina control slurry (1A). In addition, the compositions of the invention provided a significant increase in PETEOS removal rates compared to the controls. In each case, the compositions of the invention surprisingly provided a significantly greater selectivity for ruthenium removal versus silicon dioxide removal, compared to the control compositions.

EXAMPLE 2

This example illustrates the use of compositions of the invention comprising an alumina abrasive and 4-hydroxy-TEMPO to polish ruthenium and PETEOS blanket wafers.

Figure 2:
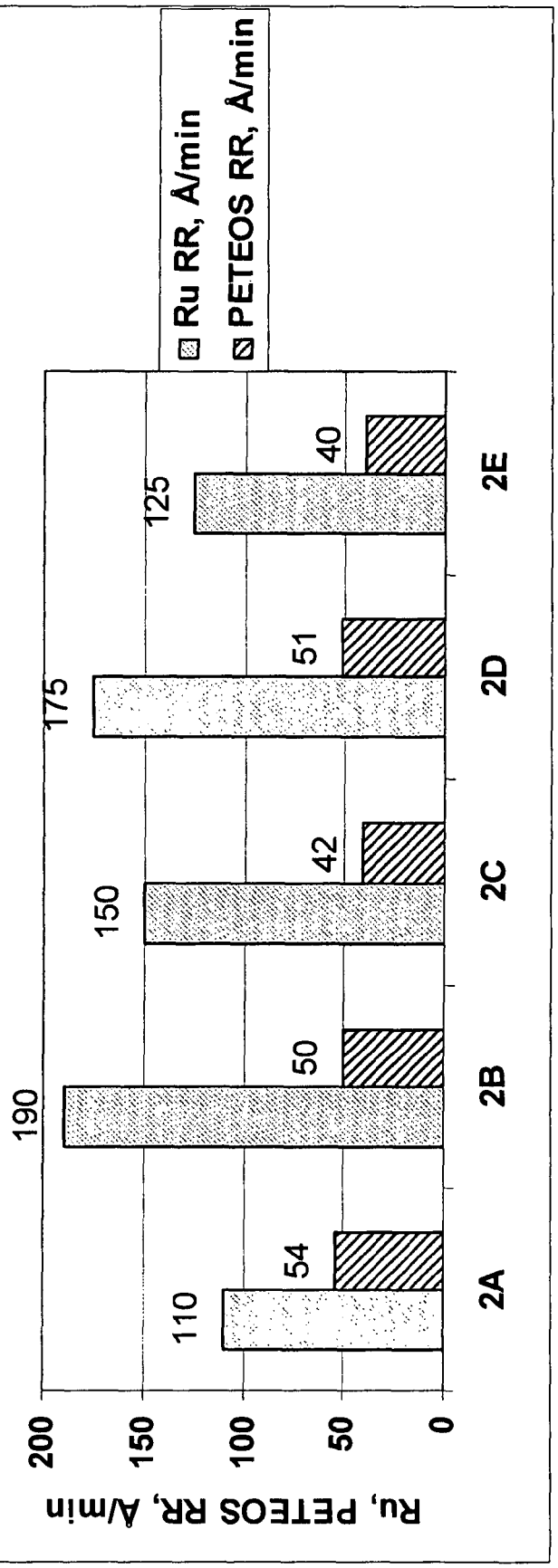
FIG. 2 shows a bar graph of ruthenium and PETEOS removal rates obtained with compositions of the invention containing an alumina abrasive, compared to a conventional alumina-based CMP composition.

CMP compositions of the invention were prepared, each of which had a pH of about 8.5, and the formulations shown in Table 2, wherein the alumina referred to in Table 2 is alpha-alumina. The compositions were utilized to polish ruthenium and PETEOS blanket wafers (about 4-inch diameter) in the presence of about 1 percent by weight hydrogen peroxide, on a Logitech polisher having a D100 polishing pad, under the following polishing conditions: platen speed of about 93 rpm, carrier speed of about 90 rpm, down pressure of about 3.1 psi, and a slurry flow rate of about 180 mL/min. FIG. 2 provides a graph of the ruthenium and PETEOS removal rates observed for each composition, in comparison to a control composition comprising about 0.7 percent by weight alpha-alumina having no added N—O ligand.

TABLE 2

| Example | Formulation |
| --- | --- |
| 2A control | 0.7 wt. % alumina (98 nm mean particle size) |
| 2B | 0.7 wt. % alumina (98 nm mean particle size), 0.05 wt. % 4-HOT |
| 2C | 0.7 wt. % alumina (98 nm mean particle size), 0.05% 4-HOT, and about 1 molar equiv. of ascorbic acid relative to 4-HOT |
| 2D | 0.7 wt. % alumina (98 nm mean particle size), 0.02% 4-HOT |
| 2E | 0.7 wt. % alumina (98 nm mean particle size), 0.25% 4-HOT, and about 1 molar equiv. of ascorbic acid relative to 4-HOT |

The data in FIG. 2 demonstrate that compositions of the invention (2B, 2C, 2D, and 2E) including an alumina abrasive provided significant and unexpected increases in the ruthenium removal rates compared to the conventional alumina control composition (1A), while not adversely affecting the PETEOS removal rates, thereby affording an unexpected increase in the ruthenium removal selectivity relative to silicon dioxide removal compared to the selectivity observed with the controls.

EXAMPLE 3

This example illustrates the use of compositions of the invention comprising silica and mixed silica/titania abrasives in combination with 4-hydroxy-TEMPO to polish ruthenium and PETEOS blanket wafers.

Figure 3:
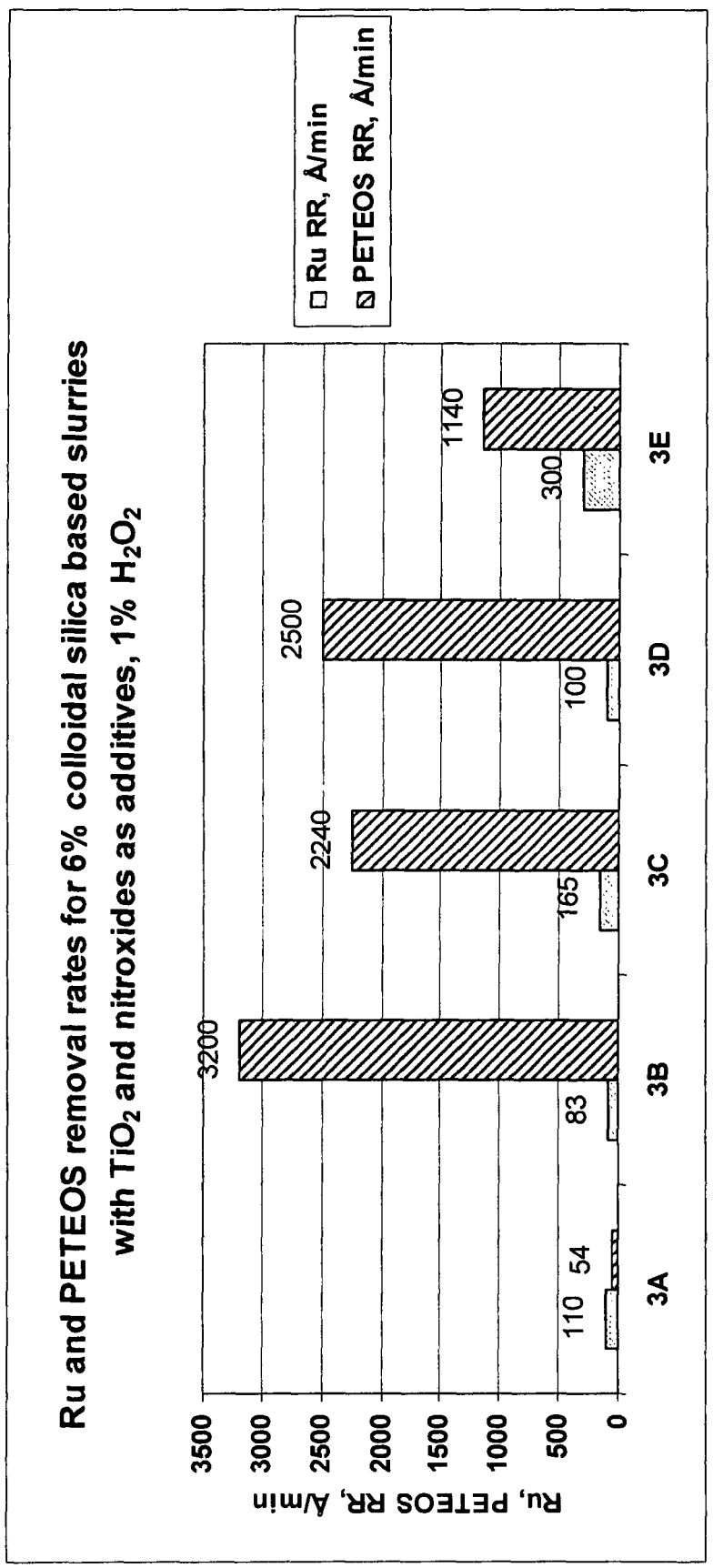
FIG. 3 shows a bar graph of ruthenium and PETEOS removal rates obtained with compositions of the invention containing a colloidal silica-containing abrasive, or a mixed silica/titania abrasive, compared to conventional silica-based and alumina-based CMP compositions.

CMP compositions of the invention were prepared, which had the formulations shown in Table 3. Each composition had a pH of about 5. The compositions were utilized to polish ruthenium and PETEOS blanket wafers (about 4-inch diameter) in the presence of about 1 percent by weight hydrogen peroxide, on a Logitech polisher having a D100 polishing pad, under the following polishing conditions: platen speed of about 93 rpm, carrier speed of about 90 rpm, down pressure of about 3.1 psi, and a slurry flow rate of about 180 mL/min. FIG. 3 provides a graph of the ruthenium and PETEOS removal rates observed for each composition, in comparison to three control compositions having no added N—O ligand (i.e., 3A: about 0.7 percent by weight alumina (pH 8.5); 3B: about 6 percent by weight colloidal silica (pH 5); and 3C: about 6 percent by weight colloidal silica combined with about 0.5 percent by weight titanium dioxide at pH 5).

TABLE 3

| Example | Formulation |
| --- | --- |
| 3A control | 0.7 wt. % alumina (98 nm mean particle size) |
| 3B control | 6 wt. % colloidal silica (38 nm mean particle size) |
| 3C control | 6 wt. % colloidal silica (38 nm mean particle size) and 0.5 wt. % titanium dioxide (150 nm mean particle size) |
| 3D | 6 wt. % colloidal silica (38 nm mean particle size) and 0.5 wt. % titanium dioxide (150 nm mean particle size), 0.05 wt. % 4-HOT |
| 3E | 6 wt. % colloidal silica (38 nm mean particle size) and 0.5 wt. % titanium dioxide (98 nm mean particle size), 0.05 wt. % 4-HOT, and about 1 molar equiv. of ascorbic acid relative to 4-HOT |

The data in FIG. 3 demonstrate that compositions of the invention (3D and 3E) including a combination of silica and titania provided for selectivity of PETEOS removal over ruthenium removal, while maintaining a ruthenium removal rate of at least about 100 Å/min. Surprisingly, composition 3E, containing ascorbic acid, also increased the Ru removal rate by about 80 percent, compared to control 3C.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for polishing a substrate comprising ruthenium and silicon dioxide, the method comprising abrading a surface of the substrate comprising ruthenium and silicon dioxide with a CMP composition comprising about 1 to about 10 percent by weight of a particulate abrasive selected from the group consisting of alumina, titania, and a combination thereof, suspended in an aqueous carrier containing about 0.01 to about 0.5 percent by weight of a nitroxide compound; wherein, in the presence of hydrogen peroxide, the nitroxide compound is capable of preventing the deposition of ruthenium species having an oxidation state of IV or higher on the surface of the substrate, and concomitantly forming a soluble Ru(II) nitroxide coordination complex with oxidized ruthenium formed during CMP of the substrate.

2. A method for polishing a substrate comprising ruthenium and silicon dioxide, the method comprising abrading a surface of the substrate comprising ruthenium and silicon dioxide with a CMP composition comprising a particulate abrasive selected from the group consisting of (a) colloidal silica or (b) a combination of colloidal silica and titania, suspended in an aqueous carrier containing a nitroxide compound wherein, in the presence of an oxidizing agent, the nitroxide compound is capable of preventing the deposition of ruthenium species having an oxidation state of IV or higher on the surface of the substrate, and concomitantly, forming a soluble Ru(II) N—O coordination complex with oxidized ruthenium formed during CMP of the substrate.

3. A chemical-mechanical polishing (CMP) method for selectively removing ruthenium from the surface of a substrate in preference to silicon dioxide, the method comprising the steps of
   (a) contacting a surface of a substrate comprising ruthenium and silicon dioxide with a polishing pad and an aqueous CMP composition in the presence of an oxidizing agent; and
   (b) causing relative motion between the substrate and the polishing pad while maintaining a portion of the CMP composition and oxidizing agent in contact with the surface between the pad and the substrate for a period of time sufficient to abrade at least a portion of the ruthenium present in the substrate from the surface;
   wherein the CMP composition contains a particulate abrasive selected from the group consisting of alumina, titania, and a combination thereof; the particulate abrasive being suspended in an aqueous carrier containing a ruthenium-coordinating oxidized nitrogen ligand (N—O ligand), the N—O ligand comprising a nitroxide compound; wherein, in the presence of the oxidizing agent, the N—O ligand is capable of preventing the deposition of ruthenium species having an oxidation state of IV or higher on the surface of the substrate, and concomitantly is capable of forming a soluble Ru(II) N—O coordination complex with oxidized ruthenium formed during CMP of the substrate.

4. The method of claim 3 wherein the particulate abrasive is present in the composition at a concentration in the range of about 1 to about 10 percent by weight.

5. The method of claim 3 wherein the N—O ligand is present in the composition at a concentration in the range of about 0.01 to about 0.5 percent by weight.

6. The method of claim 3 wherein the particulate abrasive is alpha-alumina.

7. The method of claim 3 wherein the N—O ligand comprises a nitroxide compound selected from the group consisting of 2,2,6,6-tetramethylpiperidinel-oxyl, 4-hydroxy-2,2,6,6-tetramethylpiperidine-1-oxyl, an imino nitroxide, a nitronyl nitroxide, and a combination thereof.

8. The method of claim 3 wherein the composition further comprises ascorbic acid.

9. The method of claim 8 wherein the ascorbic acid is present in the composition in an amount that is about equimolar to the amount of N—O ligand in the composition.

10. The method of claim 3 wherein the oxidizing agent comprises hydrogen peroxide.

11. The method of claim 10 wherein the hydrogen peroxide is present at a concentration in the range of about 1 to about 5 percent by weight, based on the combined weight of the composition and hydrogen peroxide.

12. A chemical-mechanical polishing (CMP) method for selectively removing dioxide from the surface of a substrate in preference to ruthenium, the method comprising the steps of:
   (a) contacting a surface of a substrate comprising ruthenium and silicon dioxide with a polishing pad and an aqueous CMP composition in the presence of an oxidizing agent; and
   (b) causing relative motion between the substrate and the polishing pad while maintaining a portion of the CMP composition and the oxidizing agent in contact with the surface between the pad and the substrate for a period of time sufficient to abrade at least a portion of the ruthenium present in the substrate from the surface;
   wherein the CMP composition contains a particulate abrasive comprising colloidal silica suspended in an aqueous carrier containing a ruthenium-coordinating oxidized nitrogen ligand (N—O ligand), the N—O ligand comprising a nitroxide compound; and, in the presence of the oxidizing agent, the N—O ligand is capable of preventing the deposition of ruthenium species having an oxidation state of IV or higher on the surface of the substrate, and concomitantly is capable of forthing a soluble Ru(II) N—O coordination complex with oxidized ruthenium formed during CMP of the substrate.

13. The method of claim 12 wherein the particulate abrasive further comprises titania.

14. The method of claim 12 wherein the particulate abrasive is present in the composition at a concentration in the range of about 1 to about 10 percent by weight.

15. The method of claim 12 wherein the N—O ligand is present in the composition at a concentration in the range of about 0.01 to about 0.5 percent by weight.

16. The method of claim 12 wherein the N—O ligand comprises a nitroxide compound selected from the group consisting of 2,2,6,6-tetramethylpiperidine-1-oxyl, 4-hydroxy-2,2,6,6-tetramethylpiperidine-1-oxyl, an imino nitroxide, a nitronyl nitroxide, and a combination thereof.

17. The method of claim 12 wherein the composition further comprises ascorbic acid.

18. The method of claim 17 wherein the ascorbic acid is present in the composition in an amount that is about equimolar to the amount of N—O ligand in the composition.

19. The method of claim 12 wherein the oxidizing agent comprises hydrogen peroxide.

20. The method of claim 19 wherein the hydrogen peroxide is present at a concentration in the range of about 1 to about 5 percent by weight, based on the combined weight of the composition and the hydrogen peroxide.

* * * * *